(12) United States Patent
Lee et al.

(10) Patent No.: US 8,039,772 B2
(45) Date of Patent: Oct. 18, 2011

(54) MICROWAVE RESONANCE PLASMA GENERATING APPARATUS AND PLASMA PROCESSING SYSTEM HAVING THE SAME

(75) Inventors: Young-dong Lee, Yougin-si (KR); Igor Antonovich Kossyi, Moscow (RU); Mamikon Aramovich Misakyan, Moscow (RU); Merab Ivanovich Taktakishvili, Moscow (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 1454 days.

(21) Appl. No.: 11/492,122

(22) Filed: Jul. 25, 2006

(65) Prior Publication Data

US 2007/0045244 A1 Mar. 1, 2007

(30) Foreign Application Priority Data

Aug. 24, 2005 (KR) .................. 10-2005-0077941

(51) Int. Cl.
 *B23K 10/00* (2006.01)
(52) U.S. Cl. ......... 219/121.43; 219/121.41; 219/121.44; 219/121.52; 118/723 R; 118/723 MW; 315/111.21; 156/345.41
(58) Field of Classification Search ............. 219/121.36, 219/121.48, 121.41, 121.43; 118/723 R, 118/723 MW, 723 AN; 204/298.38; 156/345.36, 156/345.41
See application file for complete search history.

(56) References Cited

U.S. PATENT DOCUMENTS

| | | | |
|---|---|---|---|
| 4,473,736 A * | 9/1984 | Bloyet et al. ............. | 219/121.48 |
| 5,311,103 A | 5/1994 | Asmussen et al. | |
| 5,389,153 A * | 2/1995 | Paranjpe et al. ....... | 118/723 MP |
| 5,487,875 A | 1/1996 | Suzuki | |
| 5,565,118 A * | 10/1996 | Asquith et al. ........... | 219/121.57 |
| 5,734,143 A * | 3/1998 | Kawase et al. ........... | 219/121.43 |
| 6,175,183 B1 | 1/2001 | Liehr | |
| 6,734,385 B1 * | 5/2004 | Bark et al. ............... | 219/121.48 |
| 7,164,095 B2 * | 1/2007 | Lee et al. .................. | 219/121.5 |

(Continued)

FOREIGN PATENT DOCUMENTS

DE 41 36 297 A1 5/1993

(Continued)

OTHER PUBLICATIONS

Singh, A. et al: "Experimental study of interaction of microwaves with a nonmagnetized pulsed-plasma column", Journal of Applied Physics, vol. 72, No. 5, Sep. 1, 1992, pp. 1707-1719, XP002411564, ISSN: 0021-8979.

*Primary Examiner* — Mark Paschall
(74) *Attorney, Agent, or Firm* — Sughrue Mion, PLLC

(57) ABSTRACT

A microwave resonance plasma generating apparatus, a plasma processing system having the same and a method of generating a microwave resonance plasma are provided. The apparatus includes a microwave generating unit which generates a microwave, and a plasma producing unit which produces electrons and photons of high energy using the microwave generated from the microwave generating unit. The plasma producing unit includes a coaxial waveguide having an inner electrode disposed adjacent to the microwave generating unit, an outer electrode connected to the microwave generating unit and disposed to coaxially surround a portion of the inner electrode, the outer electrode being shorter than the inner electrode, and a dielectric tube disposed between the inner electrode and the outer electrode to insulate between the inner electrode and the outer electrode. The coaxial waveguide utilizes a principle of "cut or truncated electrode of coaxial waveguide" and a resonance phenomenon of Langmiur.

33 Claims, 11 Drawing Sheets

U.S. PATENT DOCUMENTS

2002/0043342 A1    4/2002   Taniguchi et al.

FOREIGN PATENT DOCUMENTS

| | | |
|---|---|---|
| JP | 61-284033 A | 12/1986 |
| JP | 1-184922 A | 7/1989 |
| JP | 10-229000 A | 8/1998 |
| JP | 2000-286094 A | 10/2000 |
| JP | 2002-124196 A | 4/2002 |
| JP | 2002-528891 A | 9/2002 |
| JP | 2003-142460 A | 5/2003 |
| JP | 2004-055614 A | 2/2004 |
| JP | 2005-089814 A | 4/2005 |
| JP | 2005-526359 A | 9/2005 |
| KR | 10-2001-0091250 A | 10/2001 |

\* cited by examiner

MICROWAVE RESONANCE PLASMA GENERATING APPARATUS AND PLASMA PROCESSING SYSTEM HAVING THE SAME

CROSS-REFERENCE TO RELATED APPLICATIONS

This application claims priority under 35 U.S.C. §119 from Korean Patent Application No. 10-2005-0077941, filed on Aug. 24, 2005, the entire content of which is incorporated herein by reference.

BACKGROUND OF THE INVENTION

1. Field of the Invention

Apparatuses and methods consistent with the present invention relate to plasma generating, and more particularly, to a microwave resonance plasma generating apparatus and a plasma processing system having the same, which is used for a semiconductor substrate processing for etching and removing a thin film from a substrate or depositing the thin film on the substrate.

2. Description of the Related Art

In recent years, as a need of high speed microprocessors and high recording density memories increases, an ultra large scale integrated (ULSI) circuit made of one semiconductor chip having many elements mounted thereon have been actively developed. To manufacture such a next generation ULSI circuit, it is necessary to process a 30 cm wafer having a design standard of less than 0.1 μm by using plasma. At this time, the plasma should have a high density of more than $10^{11}$ $cm^{-3}$ and a large diameter of more than 40 cm at a low pressure of less than 50 mTorr. Particularly, to manufacture a large electronic device such as a flat panel display and a solar cell, the plasma should have a diameter of at least 1 m.

In order to embody the ULSI circuit technique, it requires that a high performance deposition and/or etching device is used during a manufacturing process of the semiconductor chip. As examples of the high performance deposition and/or etching device, a plasma etcher, a plasma sputtering system, a plasma enhanced chemical vapor deposition PECVD system and the like are well-known.

FIG. 1 is a schematic cross-sectional view illustrating an electron cyclotron resonance (ECR) plasma processing apparatus 10 that uses a microwave resonance phenomenon. The ECR plasma processing apparatus 10 is adapted for use in a plasma etcher, a plasma sputtering system, or a PECVD system.

As illustrated in FIG. 1, the ECR plasma processing apparatus 10 includes a magnetron 11, a waveguide 13, a horn antenna 14, a resonance channel 15, and an electromagnet 16.

The waveguide 13 propagates a microwave generated from the magnetron 11 to the horn antenna 14. The horn antenna 14 propagates the microwave transmitted thorough the waveguide 13 into the resonance channel 15, so that the microwave can form a resonance mode in the resonance channel 15.

The electromagnet 16 is disposed around the resonance channel 15 to form a magnetic field in a direction parallel to the propagation direction of the microwave, that is, a direction of Z, in the resonance channel 15.

The microwave moved into the resonance channel 15 transfers energy to electrons that gyro-motion about the magnetic field formed in the resonance channel 15 by the electromagnet 16. The electrons to which the energy is applied collide against a gas in the resonance channel 15 to ionize the gas and thus to form plasma.

Such a conventional ECR plasma processing apparatus 10 has an advantage that can obtain plasma of high density at a relatively low pressure by using a microwave having a high frequency of about 2.45 GHz. However, since the conventional ECR plasma processing apparatus 10 requires a magnetic field of about 875 Gauss for producing the plasma, it needs the electromagnet 16 that consumes much electric power. Further, the conventional ECR plasma processing apparatus 10 does not uniformly form the plasma.

Further, in order to maximize a plasma producing efficiency, the conventional ECR plasma processing apparatus 10 should be designed in an optimum ECR condition. Therefore, process conditions of the conventional ECR plasma processing apparatus 10 may not be freely selected, but restricted.

Also, the conventional ECR plasma processing apparatus 10 uses a plurality of parts including the waveguide 13, the horn antenna 14, the electromagnet 15, and the like. Accordingly, there is a problem that the structure may be complicated, the size may be enlarged, and the manufacturing cost may be increased.

In order to solve this problem, there has been provided a surface wave excitation microwave plasma processing apparatus 50 that uses an annular waveguide 53 having a plurality slots formed at an inner side surface thereof, as illustrated in FIG. 2. The apparatus 50 is disclosed in U.S. Pat. No. 5,487,875.

The microwave plasma processing apparatus 50 includes a microwave generating unit (not illustrated) such as a magnetron, a waveguide 53, and a plasma generating chamber 51.

As illustrated in FIGS. 3 through 5, a microwave 73 generated from the microwave generating unit is guided to the waveguide 53, and is then distributed left and right by a distributing block 71 to propagate in the waveguide 53 having a wavelength longer than a free space.

Then, the microwave 73 is introduced into the plasma generating chamber 51 as a leaky wave 75 through slots 72 formed at intervals of ½ or ¼ of the wavelength and a dielectric body 52. The leaky wave 75 generates plasma 77 in the vicinity of the slots 72.

Also, the microwave incident at an angle of more than Brewster angle to a straight line vertical to a surface of the dielectric body 52 is total-reflected at the surface of the dielectric body 52, and is propagated as a surface wave 76 inside the dielectric body 52. A leaky electric field of the surface wave 76 also produces plasma 77'.

The produced plasma 77 and 77' excites a gas supplied into a process chamber 61 through a gas injection tube 65, and the excited gas processes a surface of a substrate 62 disposed on a substrate holder 63.

This microwave plasma processing apparatus 50 as described above has an advantage that can obtain the plasma of high density with a relatively simplified structure compared with the ECR plasma generating apparatus 10 including the electromagnet and the like to increase the manufacturing cost and the size.

However, the microwave plasma processing apparatus 50 is configured, such that the microwave 73 generated from the microwave generating unit is propagated into the plasma generating chamber 51 through the slots 72 along the annular waveguide 53. Accordingly, the microwave propagated into the plasma generating chamber 51 has different intensity according to a position of slots due to attenuating characteristic of wave. As a result, the plasma is unevenly formed, and the plasma producing efficiency is deteriorated.

Therefore, what is needed is a microwave plasma processing apparatus capable of obtaining a sufficient plasma producing efficiency while having a relatively simplified structure so as not to increase the size and the manufacturing cost.

SUMMARY OF THE INVENTION

Exemplary embodiments of the present inventive concept overcome the above disadvantages and other disadvantages not described above. Also, the present inventive concept is not required to overcome the disadvantages described above, and an exemplary embodiment of the present inventive concept may not overcome any of the problems described above. Accordingly, the present general inventive concept provides a microwave resonance plasma generating apparatus, a plasma processing system having the same and a method of generating a microwave resonance plasma, which can increase a plasma producing efficiency, simplify a structure, and reduce a manufacturing cost.

Additional aspects of the present general inventive concept will be set forth in part in the description which follows and, in part, will be obvious from the description, or may be learned by practice of the exemplary embodiments of the general inventive concept.

The foregoing and/or other aspects the present general inventive concept may be achieved by providing a microwave resonance plasma generating apparatus comprising a microwave generating unit having an antenna which generates a microwave, and a plasma producing unit which produces electrons and photons of high energy by making use of an energy of the microwave generated from the microwave generating unit, wherein the plasma producing unit comprises a coaxial waveguide comprising an inner electrode disposed adjacent to the antenna, an outer electrode connected to the microwave generating unit and disposed to coaxially surround a portion of the inner electrode, the outer electrode being shorter than the inner electrode, and a dielectric tube disposed between the inner electrode and the outer electrode to insulate between the inner electrode and the outer electrode.

The microwave generating unit may comprise a magnetron. Particularly, the magnetron may be operated with an electric power of 1 KW or less at a frequency of about 2.45 GHz. Also, the magnetron may be cooled by circulating heat exchanging substance.

The outer electrode may have a tip to tightly contact the dielectric tube, the tip being located at one end of the outer electrode that is disposed on the opposite side of the other end of the outer electrode adjacent to the microwave generating unit. Particularly, the outer electrode may be formed in a truncated conical shape in which the one end inclines at an angle and the tip has a sharp edge, an I-shaped cylindrical shape in which the outer electrode contacts the dielectric tube over a full length, a cylindrical shape in which the one end is vertically bent to make the tip to contact the dielectric tube, or a truncated conical shape in which the outer electrode is tapered over a full length and the tip of the one end contacts the dielectric tube.

Also, the outer electrode may be configured such that a tip has an inner diameter D determined to satisfy the formula:

$D < 1.841 \times c/\pi f$, where c is a speed of light, and f is a frequency of microwave, wherein the tip is located at one end of the outer electrode that is disposed on the opposite side of the other end of the outer electrode adjacent to the microwave generating unit.

Alternatively, the microwave resonance plasma generating apparatus of the present general inventive concept may further comprise a resonating unit disposed between the microwave generating unit and the coaxial waveguide of the plasma producing unit to impedance-match the microwave.

The resonating unit may comprise a resonance cavity connected to the microwave generating unit and formed to receive and close up a portion of the inner electrode of the coaxial waveguide.

At this time, the inner electrode may comprise a first cylindrical tube having an closed end, and a second cylindrical tube disposed in the first cylindrical tube, wherein a fluid is permitted to circulate through the second cylindrical tube and a space between the first cylindrical tube and the second cylindrical tube from a fluid source. The fluid may comprise heat exchanging substance.

Also, the portion of the inner electrode inserted in the resonance cavity may be formed in the shape of a loop, such that the microwave is maximally transferred by the impedance matching.

The foregoing and/or other aspects of the present general inventive concept may also be achieved by providing a plasma processing system comprising a process chamber having a substrate holder to which a substrate is fixed, a first gas supplying unit which supplies a gas into the process chamber, and at least one microwave resonance plasma generating apparatus comprising a microwave generating unit disposed outside the process chamber, the microwave generating unit having an antenna to generate a microwave, and a plasma producing unit disposed at the process chamber to produce electrons and photons of high energy by making use of energy of the microwave generated from the microwave generating unit, wherein the plasma producing unit comprises a coaxial waveguide comprising an inner electrode disposed adjacent to the antenna and extended into the process chamber, an outer electrode connected to the microwave generating unit and disposed to coaxially surrounding a portion of the inner electrode in the process chamber, the outer electrode being shorter than the inner electrode, and a dielectric tube disposed between the inner electrode and the outer electrode to insulate between the inner electrode and the outer electrode.

An inner pressure p of the process chamber may be adjusted in a range of 0.001 Torr$\leq$p$\leq$2 Torr.

The microwave generating unit may comprise a magnetron. Particularly, the magnetron may be operated with an electric power of 1 KW or less at a frequency of about 2.45 GHz, and cooled by circulating heat exchanging substance.

The outer electrode may have a tip to tightly contact the dielectric tube, the tip being located at an end of the outer electrode extended into the process chamber. Particularly, the outer electrode may be formed in a truncated conical shape in which the end inclines at an angle and the tip has a sharp edge, an I-shaped cylindrical shape in which the outer electrode contacts the dielectric tube over a full length, a cylindrical shape in which the end is vertically bent to make the tip to contact the dielectric tube, or a truncated conical shape in which the outer electrode is tapered over a full length and the tip of the end contacts the dielectric tube.

Also, the outer electrode may be configured such that a tip has an inner diameter D determined to satisfy the following formula:

$$D < 1.841 \times c/\pi f,$$

where c is a speed of light, and f is a frequency of microwave, wherein the tip is located at one end of the outer electrode that is disposed on the opposite side of the other end of the outer electrode adjacent to the microwave generating unit.

Alternatively, the microwave resonance plasma generating apparatus may further comprise a resonating unit disposed between the microwave generating unit and the coaxial waveguide of the plasma producing unit to impedance-match the microwave.

The resonating unit may comprise a resonance cavity connected to the microwave generating unit outside the process chamber and formed to receive and close up a portion of the inner electrode of the coaxial waveguide.

At this time, the inner electrode may comprise a first cylindrical tube having an closed end extended into the process chamber, and a second cylindrical tube disposed in the first cylindrical tube, wherein a fluid is permitted to circulate through the second cylindrical tube and a space between the first cylindrical tube and the second cylindrical tube from a fluid source. The fluid may comprise heat exchanging substance.

Also, the portion of the inner electrode inserted in the resonance cavity may be formed in the shape of a loop such that the microwave is maximally transferred by, the impedance matching.

The plasma processing system of the present general inventive concept may further comprise a second gas supplying unit which additionally supplies a gas into the process chamber.

The at least one microwave resonance plasma generating apparatus may be vertically disposed. Alternatively, the at least one microwave resonance plasma generating apparatus may be horizontally disposed.

Also, the plasma processing system of the present general inventive concept may be a plasma etcher in which a bias voltage is applied to the substrate holder. Alternatively, the plasma processing system of the present general inventive concept may be a plasma sputtering system further comprising a sputter target to which a bias voltage is applied, the sputter target being disposed below the substrate holder, or plasma enhanced chemical vapor deposition (PECVD) system in which a bias voltage is not applied to the substrate holder.

The foregoing and/or other aspects of the present general inventive concept may also be achieved by providing a method of generating a microwave resonance plasma using a plasma processing system comprising a process chamber, a gas supplying unit, a microwave generating unit, an inner electrode, an outer electrode and a dielectric tube. The method comprises generating a microwave using the microwave unit, generating a supercritical plasma at an area of contact between the dielectric tube and the outer electrode using the microwave, causing the supercritical plasma to propagate along the dielectric tube using an electromagnetic wave formed along the dielectric tube, thereby generating a primary plasma layer, causing the electromagnetic wave to nonlinearly interact with the supercritical plasma, and causing the primary plasma layer to emit super thermal electrons and UV radiation, thereby ionizing a gas supplied by the gas supplying unit to generate a secondary plasma layer. Here, the inner electrode is disposed adjacent to the microwave generating unit, the outer electrode is connected to the microwave generating unit and disposed to coaxially surround a portion of the inner electrode, the outer electrode being shorter than the inner electrode, and the dielectric tube is disposed between the inner electrode and the outer electrode to insulate between the inner electrode and the outer electrode. In this case, plasma density in the first plasma layer is higher than in the secondary plasma layer.

BRIEF DESCRIPTION OF THE DRAWINGS

These and/or other aspects of the present general inventive concept will become apparent and more readily appreciated from the following description of exemplary embodiments, taken in conjunction with the accompanying drawings of which.

DETAILED DESCRIPTION OF THE EXEMPLARY EMBODIMENTS

Figure 1:
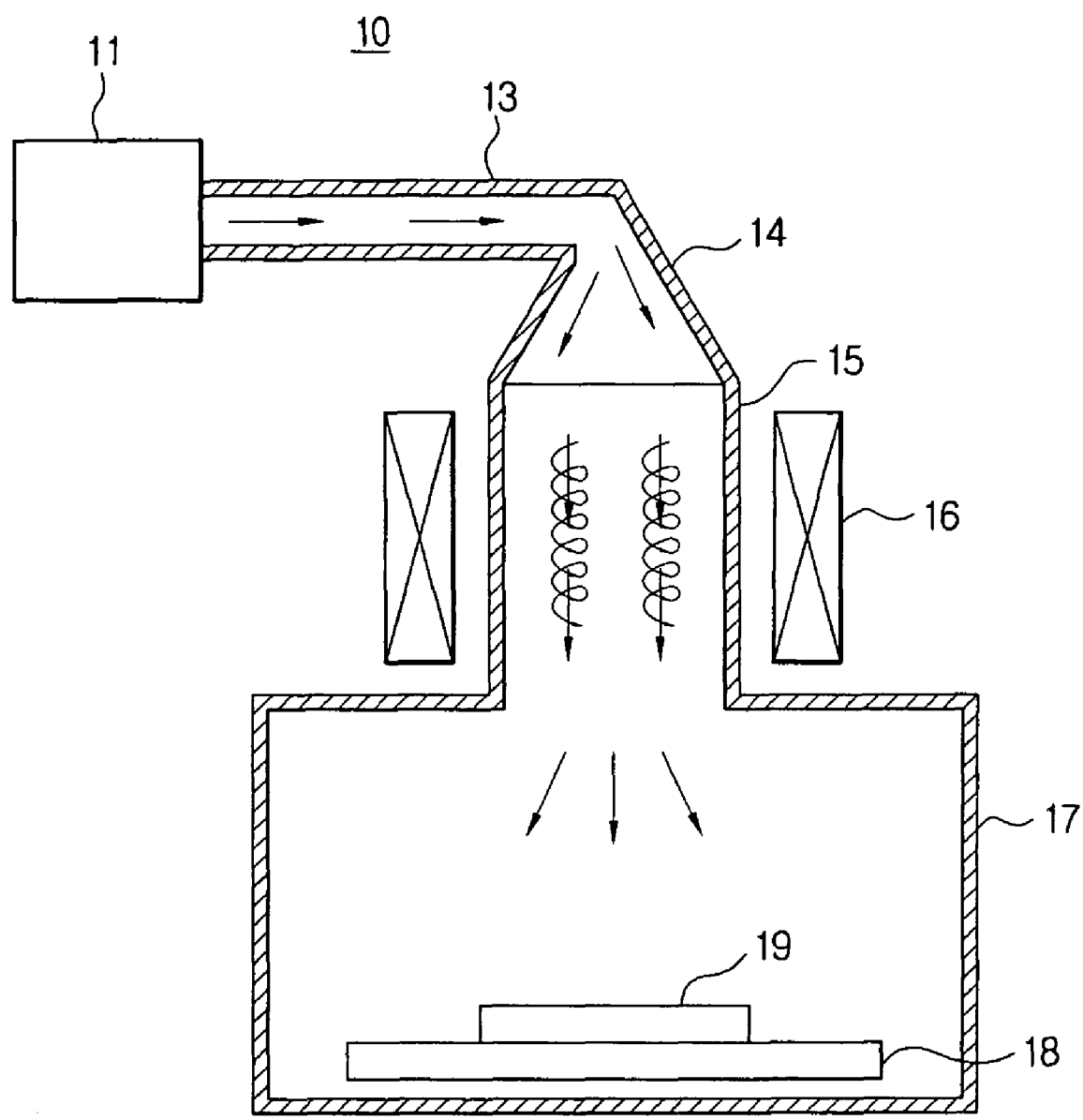
FIG. 1 is a schematic cross-sectional view illustrating an example of a plasma processing apparatus according to a related art.
Figure 2:
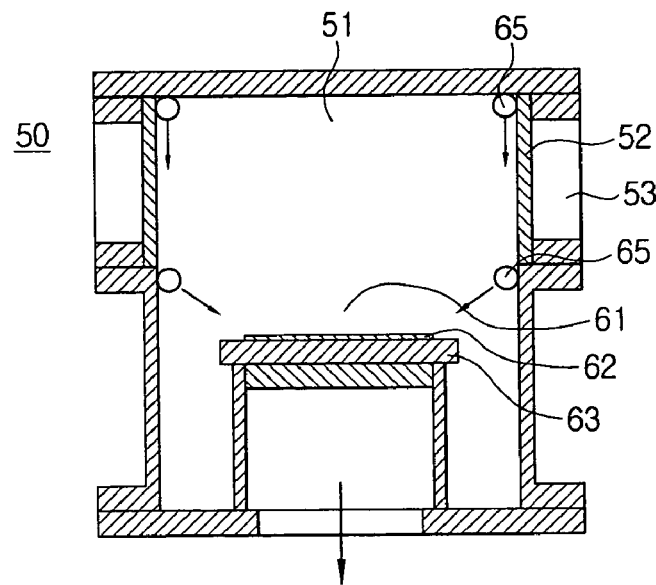
FIG. 2 is a schematic cross-sectional view illustrating another example of a plasma processing apparatus according to a related art.
Figure 3:
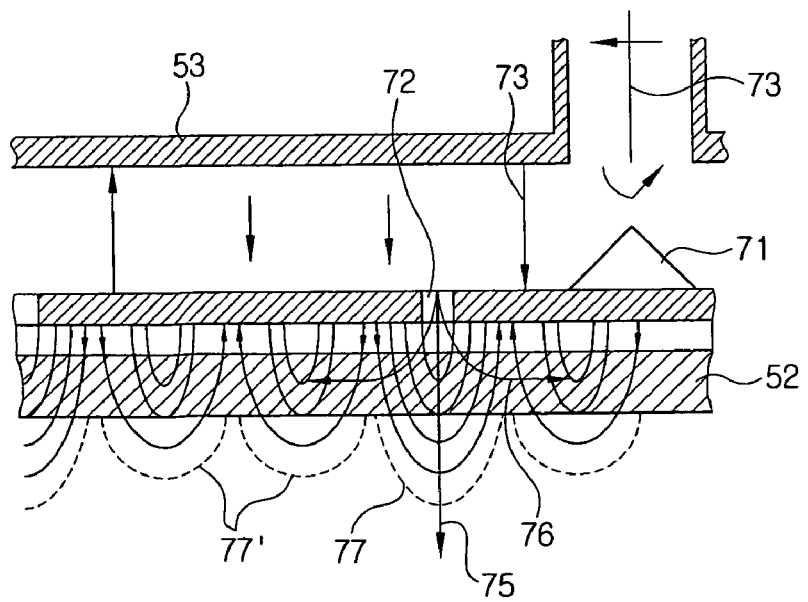
FIG. 3 is a partial cross-sectional view illustrating a plasma generating mechanism of the plasma processing apparatus of FIG. 2 according to a related art.
Figure 4:
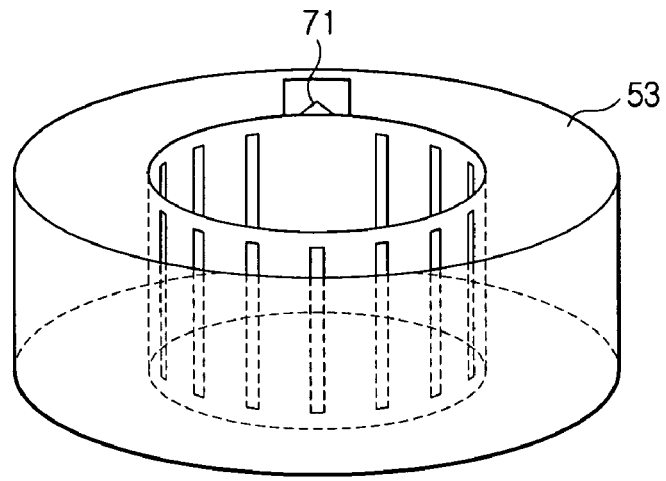
FIG. 4 is a schematic perspective view illustrating a waveguide of the plasma processing apparatus of FIG. 2 according to a related art.
Figure 5:
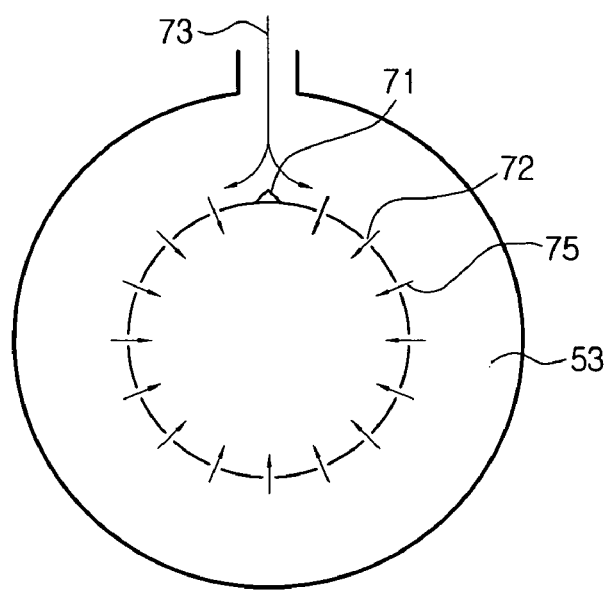
FIG. 5 is a schematic top plan view illustrating the waveguide of the plasma processing apparatus of FIG. 4 according to a related art.

Reference will now be made in detail to exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

Figure 6:
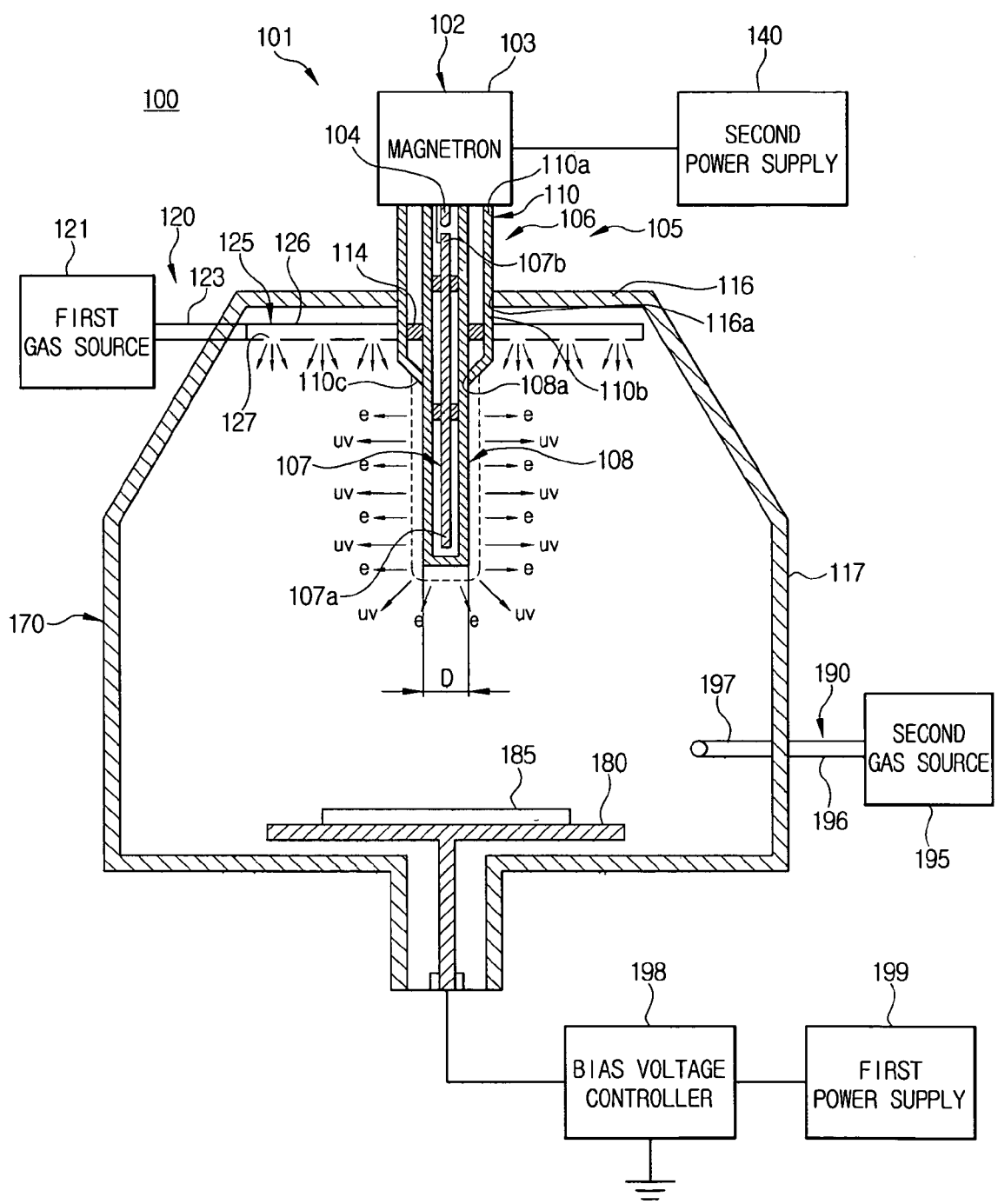
FIG. 6 is a schematic cross-sectional view illustrating a plasma etcher having a microwave resonance plasma generating apparatus according to a first exemplary embodiment of the present general inventive concept.

FIG. 6 is a schematic view illustrating a plasma processing system 100 having a microwave resonance plasma generating apparatus according to a first exemplary embodiment of the present general inventive concept.

The plasma processing system 100 of the first exemplary embodiment of the present general inventive concept is a plasma etcher that forms a selective etching pattern on a substrate 185 by evaporating or ashing a thin film such as photoresist coated on the substrate 185 using ionized plasma and reactive neutral beams or radicals of high density to remove it therefrom.

Referring to FIG. 6, the plasma processing system 100 includes a process chamber 170, a microwave resonance plasma generating apparatus 101, and a first gas supply unit 120.

Plasma is produced in the process chamber 170 by the plasma generating apparatus 101.

A substrate holder 180 is disposed at an internal center of the process chamber 170. A substrate 185 on which a thin film such as photoresist to be etched is coated is fixed to the substrate holder 180. The substrate holder 180 is made of a copper block heated or cooled by a heating/cooling circuit (not shown).

A bias voltage is applied to the substrate holder 180 from a first power supply 199 by control of a bias voltage controller 198.

The microwave resonance plasma generating apparatus 101 includes a microwave generating unit 102, and a plasma producing unit 105.

The microwave generating unit 102 includes a magnetron 103 having an antenna 104 to generate a microwave. The magnetron 103 is installed above an upper wall 116 of the process chamber 170.

A commercially obtainable general magnetron, which is operated with electric power of about 1 KW or less applied from a second power supply 140 at a frequency of about 2.45 GHz, can be used as the magnetron 103.

Also, the magnetron 103 can be configured such that it is cooled by a circulation cooling device having a heat exchanging tube to circulate heat exchanging fluid such as water, thereby stably operating the magnetron 103 and increasing lifespan thereof.

The plasma producing unit 105 is installed at the upper wall 116 of the process chamber 170. The plasma producing unit 105 converts the microwave generated from the magnetron 103 into electrons and photons of high energy, and collides the converted electrons and photons of high energy with a gas supplied into the process chamber 170 by the first gas supply unit 120 to produce plasma consisting of electrons and ions all over in the process chamber 170.

The plasma producing unit 105 includes a coaxial waveguide 106 having an inner electrode 107, an outer electrode 110, and a dielectric tube 108.

The inner electrode 107 is made of conductive metal in the shape of rod. The inner electrode 107 has a first end 107a and a second end 107b. The first end 107a is extended into the process chamber 170, and the second end 107b is disposed to space apart from the antenna 104 of the magnetron 104 with a certain gap.

The dielectric tube 108 has a cylindrical shape. A gasket 114 and a tip 110c of the second end 110b of the outer electrode 110 support the dielectric tube 108, so that the dielectric tube 108 surrounds the inner electrode 107 at a spaced-apart relation therewith. The gasket 114 functions to seal between the dielectric tube 108 and the outer electrode 110 so as to maintain the process chamber 170 at a predetermined inner pressure p to be described later, as well as to support the dielectric tube 108.

The dielectric tube 108 is made of non-conductive substance such as quartz, $Al_2O_3$, AlC, or AlN.

The outer electrode 110 is made of conductive metal in the shape of cylinder. The outer electrode 110 has a first end 110a and a second end 110b. The first end 110a is connected and grounded to the magnetron 103, and the second end 110b is protruded into the process chamber 160 through a supporting hole 116a of the upper wall 116 of the process chamber 170 to coaxially surround the dielectric tube 108 and the inner electrode 107.

Also, the outer electrode 110 has a length shorter than that of the inner electrode 107, so that the microwave propagated from magnetron 103 forms plasma by a principle of "cut or truncated electrode of coaxial waveguide". Here, the principle of "cut or truncated electrode of coaxial waveguide" means a phenomenon that when a coaxial waveguide with two electrodes having different length propagates microwave radiation, a plasma layer of sufficient high density is formed along the longer electrode from the shorter electrode to restore cut or truncated portion of the shorter electrode while acting as a conductor.

Figure 7:
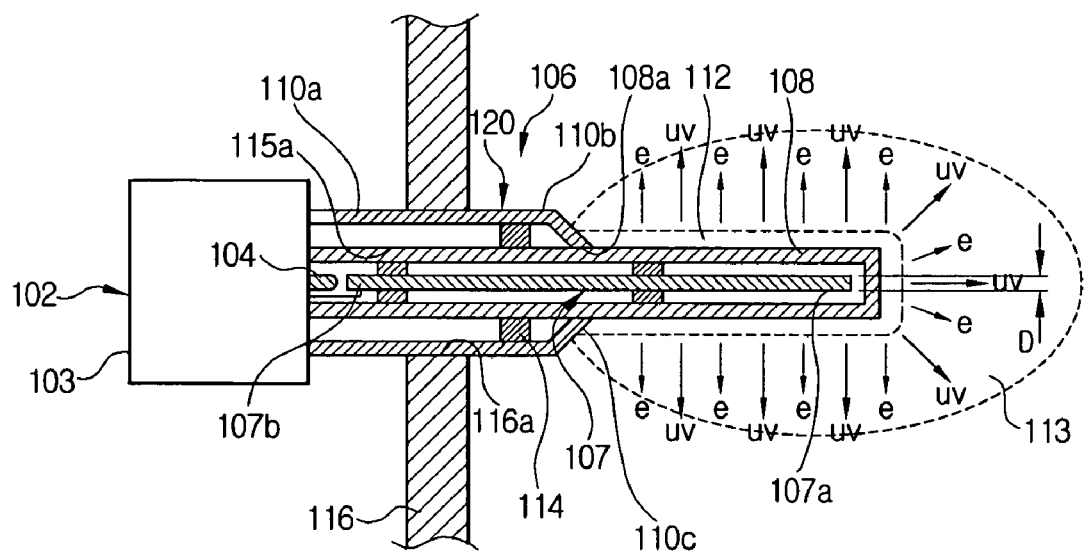
FIG. 7 is an exemplary cross-sectional view illustrating a plasma producing unit of the microwave resonance plasma generating apparatus of the plasma etcher of FIG. 6.

The second end 110b of the outer electrode 110 located in the process chamber 170 is fixed, so that the tip 110c thereof contacts a portion 108a of a surface of the dielectric tube 108. Particularly, as illustrated in FIG. 7, the second end 110b of the outer electrode 110 is formed in a shape inclined at an angle, for example, a truncated conical shape in which the tip 110c has a sharp edge, thereby easily propagating the microwave up to the tip 110c and smoothly generating plasma discharge.

Figure 9A:
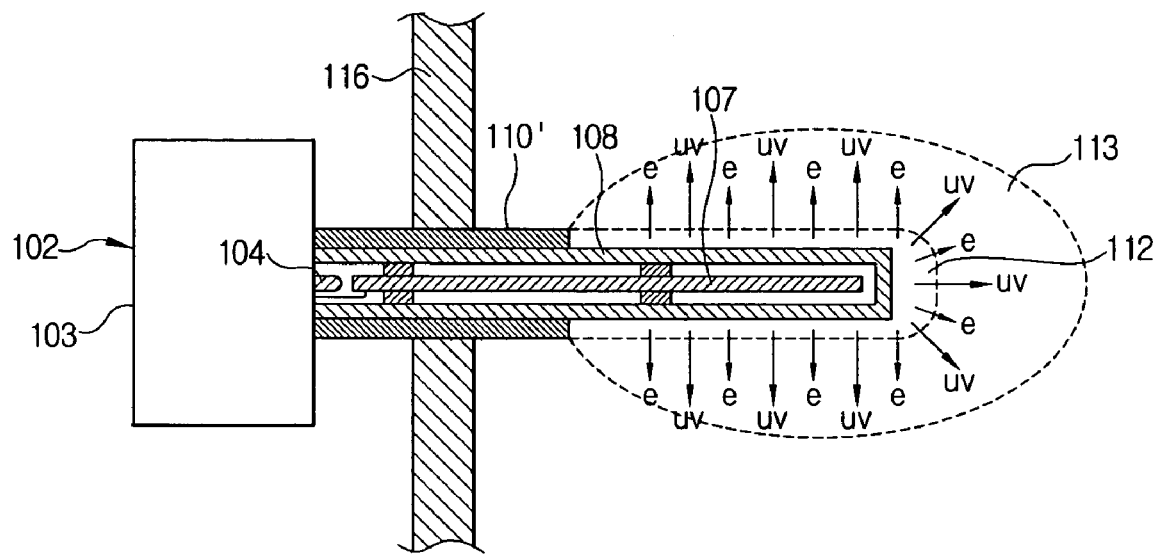
FIGS. 9A through 9C are cross-sectional views illustrating modified examples of the plasma producing unit of FIG. 7.
Figure 9B:
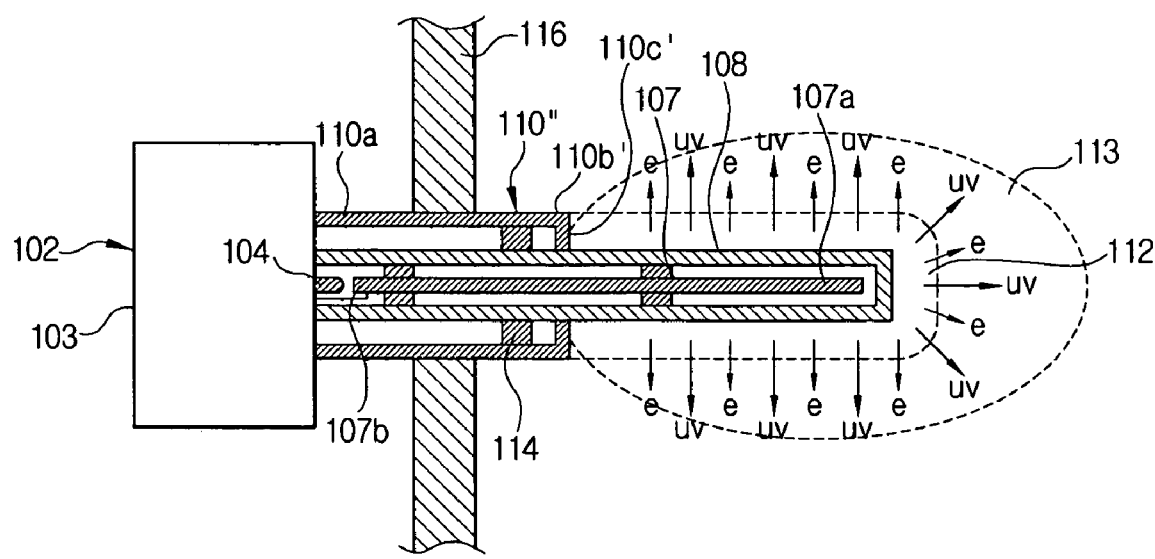
Figure 9C:
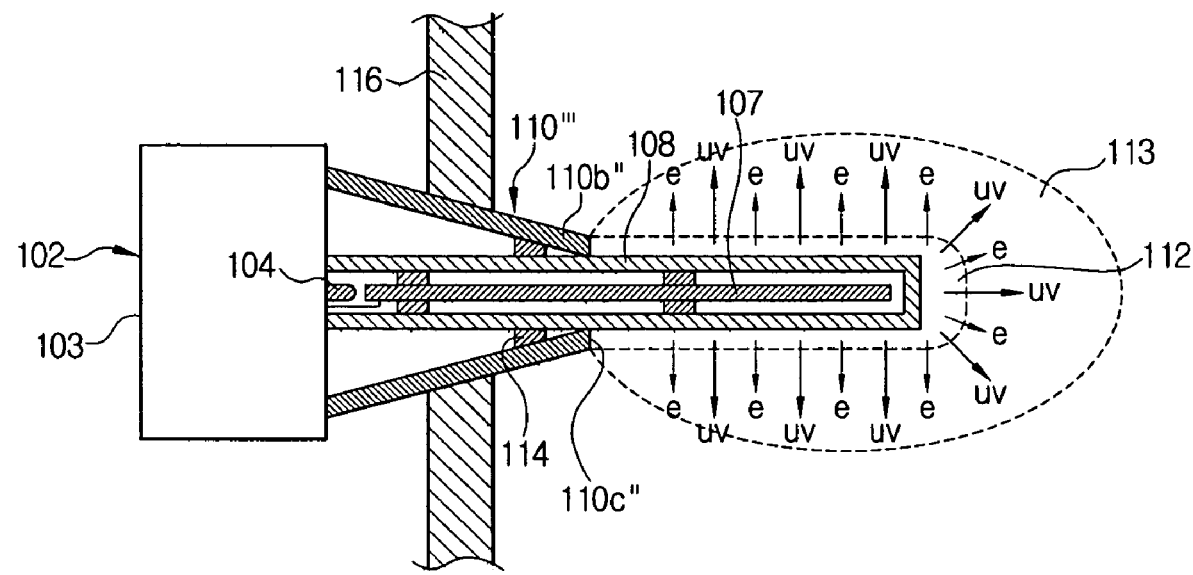

Alternatively, as illustrated in FIGS. 9A through 9C, the outer electrode 110', 110", or 110'" can be formed in an I-shaped cylindrical shape 110' in which it contacts the dielectric tube 108 over a full length, a cylindrical shape 110' in which a second end 110b' located in the process chamber 170 is vertically bent to make a tip 110c' contact the dielectric tube 108, or a truncated conical shape 110'" in which it is tapered over a full length and a tip 110c" of a second end 110b" contacts the dielectric tube 108.

Also, the tip 110c of the second end 110b of the outer electrode 110 extended into the process chamber 170 preferably, but not necessarily, has an inner diameter D determined to satisfy the following formula (1):

$$D < 1.841 \times c / \pi f \quad (1)$$

Here, the numerical value of 1.841 (this numerical value is disclosed in "Classical Electrodynamics" by Jackson D. Jackson, $2^{nd}$ edition, 356p, John Wiley & Sons.) is a solution $X_{11}$ of a formula $J_1'(X_{11})=0$ at a first order differential equation J' (n) of Bessel function Jn showing characteristic that a microwave propagates in a cylindrical waveguide, c is a speed of light, and f is a frequency of microwave.

Accordingly, if the frequency of microwave f is, for example, 2.45 GHz ($2.45 \times 10^9$ Hz), the inner diameter D is preferably, but not necessarily, determined about 7.17 cm or less since the speed of light c is about $3 \times 10^{10}$ cm/sec.

If the inner diameter D does not satisfy the above formula (1), although the outer electrode 110 is formed shorter than the inner electrode 107, the microwave propagated from the magnetron 103 does not form a plasma layer by the principle of "cut or truncated electrode of coaxial waveguide", but flows into the process chamber 170 through the first end 107a of the inner electrode 107 extended longer than the outer electrode 110.

To the contrary, if the inner diameter D satisfies the above formula (1), the microwave propagated from the magnetron 103 is reflected at the portion 108a of the surface of the dielectric tube 108 contacting the tip 110c of the second end 110b of the outer electrode 110. The reflected microwave forms a strong electric field in a pulse form at the portion 108a of the surface of the dielectric tube 108. As a result, plasma discharge occurs at the portion 108a of the surface of the dielectric tube 108, so that a plasma layer of sufficient high density is formed along the surface of the dielectric tube 108 by the principle of "cut or truncated electrode of coaxial waveguide".

An electromagnetic wave-absorbing and electron-accelerating resonance mechanism that the plasma is formed by the plasma producing unit 105 will now be described in details.

As illustrated in FIG. 7, microwave radiation propagated up to the vicinity of the surface of the dielectric tube 108 through the second end 110b of the outer electrode 110 from the magnetron 103 forms a primary plasma layer 112 having a density higher than a critical density with the principle of "cut or truncated electrode of coaxial waveguide". The primary plasma layer 112 acts as a source of generating electron and ultraviolet (UV) radiation of high energy.

More particularly, the microwave propagated along the dielectric tube 108 is concentrated to the portion 108a of the surface of the dielectric tube 108 which contacts the tip 110c of the second end 110b of the outer electrode 110 to act as a metal-dielectric contact, so that it generate plasma discharge while forming a topically strong electric field in a pulse form, thereby producing supercritical plasma. A phenomenon in which supercritical plasma is produced when concentrated microwave beam or flare is irradiated to a portion of a dielectric tube contacting a metal tube in vacuum is disclosed in details in "Generation of nonlinear waves and quasistationary currents in plasmas. Ed." by L. M. Kovirzhnykh, Trudy IOFAN, v. 16, Moscow: Nauka, 1988, 166p.

The supercritical plasma generated in the vicinity of the point which the outer electrode 110 and the dielectric tube 108 contact each other is propagated along the dielectric tube 108 to form the primary plasma layer 112. Such an extension mechanism of plasma is maintained by an electromagnetic wave, which propagates along the surface of the dielectric tube, and is almost identical to that of a conventional surfatron plasma generating apparatus disclosed in "Microwave discharge" by Carlos M. Ferreis and Michel Moisan, New York, Plenum Press, 1993.

Subsequently, the primary plasma layer 112 acts as a source of generating electron and ultraviolet UV radiation of high energy to produce a larger volume of ionized medium in the process chamber 170.

At this time, the microwave has a component of electric field in the same direction as a gradient of electron density of the primary plasma layer 112 adjacent to the surface of the dielectric tube 108, and acts to favor efficiently converting energy of microwave into energy of electrons and photons with resonance phenomenon.

Figure 8:
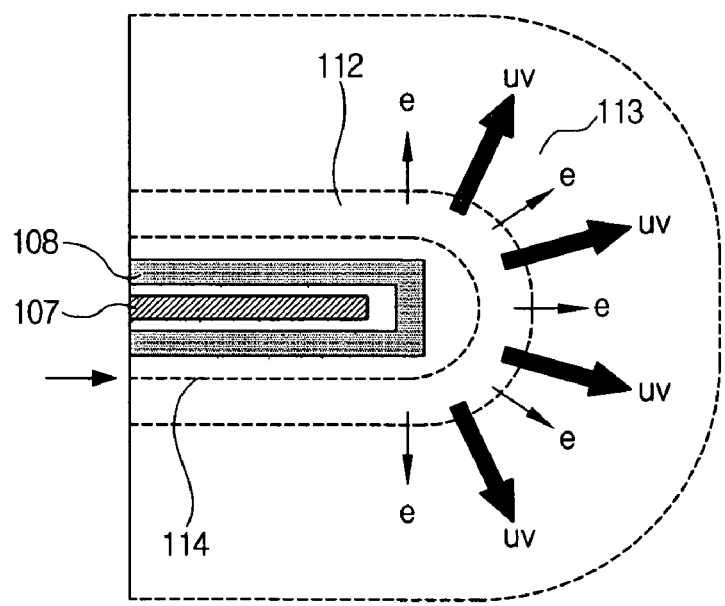
FIG. 8 is an exemplary partial cross-sectional view illustrating an operation of the plasma producing unit of FIG. 7.

The coaxial waveguide 106 is operated by a resonance effect of Langmiur. The resonance effect of Langmiur occurs at a condition that a plasma frequency $\omega_p$ of electron coincides with a circular frequency $\omega$ of microwave radiation incident on plasma and a component of electric field of microwave is parallel to a gradient of electron density of the primary plasma layer. As illustrated in FIG. 8, in a narrow resonance area around a resonance layer, that is, the primary plasma layer 114 to generate resonance, microwave radiation is very efficiently absorbed, and energy of microwave is converted to energy of electron of plasma and UV radiation. The electron of plasma and UV radiation is escaped to a peripheral gas area to ionize a gas medium, so that a secondary plasma layer 113 is produced. The secondary plasma layer 113 has electrons of low energy, which exceeds the initial primary plasma layer 112 in volume. As described above, a primary action of the waveguide 106 is to produce the primary plasma layer 112 of supercritical plasma in a small area including the resonance area where the supercritical plasma and the microwave directly interacts each other. The primary plasma layer 112 forms a source for electrons and photons of high energy, which produces the secondary plasma layer 113 consisting of electrons of low energy that greatly exceeds a microwave absorbing area, that is, the initial primary plasma layer 112 in size and volume.

The primary plasma layer 112 is composed of high density plasma ($n_e > n_{ecr}$) having a plasma density $n_e$ higher than a critical plasma density $n_{ecr}$ that is concentrated in an area having thickness of 1 to 2 cm in the vicinity of the surface of the dielectric tube 108, and the secondary plasma layer 113 is composed of low density plasma ($n_e < n_{ecr}$) having a plasma density $n_e$ lower than the critical plasma density $n_{ecr}$ that occupies almost all the process chamber 170 in volume. An expectation density of the secondary plasma layer 113 is $10^{11}$ cm$^{-3}$.

Figure 10:
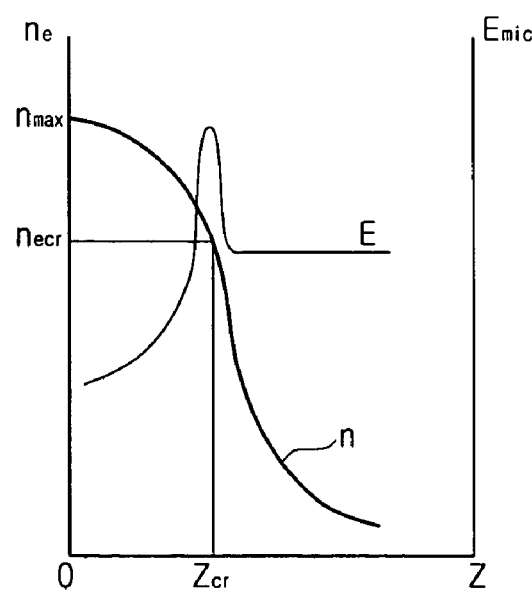
FIG. 10 is an exemplary graph illustrating a relation among a distance Z from a surface of a dielectric tube and a plasma density $n_e$ of plasma and a microwave electric field $E_{mic}$ produced in a process chamber by a coaxial waveguide of the plasma producing unit of FIG. 7.

FIG. 10 illustrates a plasma density curve n and a microwave electric field curve E, that show respectively a plasma density $n_e$ of plasma and a microwave electric field $E_{mic}$ produced in the process chamber 170 by the coaxial waveguide 106 of the plasma producing unit 105 according to a distance Z in a direction vertical to a longitudinal direction of the dielectric tube 108 from the surface of the dielectric tube 108.

As illustrated in FIG. 10, the plasma density $n_e$ is reduced according to the distance Z from the surface of the dielectric tube 108, and comes to a critical plasma density $n_{ecr}$ at a predetermined distance $Z_{cr}$ from a point 0 on which a maximum plasma density $n_{max}$ is formed. The critical plasma density $n_{ecr}$ can be expressed by the following formula 2:

$$n_{ecr} = m(\omega^2 + \gamma_{eff}^2)/4\pi e^2 \quad (2)$$

Here, m is a mass of electron, $\gamma_{eff}$ is an effective electron-neutral collision frequency, and e is a value of electron charge.

Also, the microwave electric field $E_{mic}$ abruptly increases at a point where the critical plasma density $n_{ecr}$ is formed. This phenomenon apparently occurs at a condition that the effective electron-neutral collision frequency $\gamma_{eff}$ is lower than the circular frequency $\omega$ of microwave. That is, if the pressure is very low to satisfy the condition of $\gamma_{eff} \ll \omega$, a strong resonance phenomenon occurs when the plasma frequency $\omega_p$ of electron coincides with the circular frequency $\omega$ of microwave.

A gas in the process chamber 170 collides with super-thermal electrons which obtain high energy from an electric field amplified by strong nonlinear interaction between the electromagnetic wave and the uneven supercritical plasma at the supercritical plasma layer, that is, the primary plasma layer 112, and thereby is promoted to ionize. And, when the electrons of high energy collide with the surface of the dielectric tube 108 and thus reduces speed, kinetic energy of the electrons is converted into and emitted as strong UVs. The UVs contributes to ionizing the gas. One of conditions for the strong nonlinear interaction between the electromagnetic wave and the uneven supercritical plasma is that the component of the electric field of the microwave has a component parallel to the gradient of the electron density of the primary plasma layer. In the waveguide 106 of the first exemplary embodiment of the present general inventive concept, the outer electrode 110 is located just adjacent to the outside of the dielectric tube 108, and the plasma discharge occurs from the outside of the dielectric tube 108. Since a main component of the surface wave is a longitudinal component of the electric field, the plasma discharge mainly excites a transverse magnetic wave. This means that the electric field of the surface electromagnetic wave always has a component that traverses the radical uneven plasma layer formed in the vicinity of the dielectric tube 108 surrounding the inner electrode 107.

Figure 11:
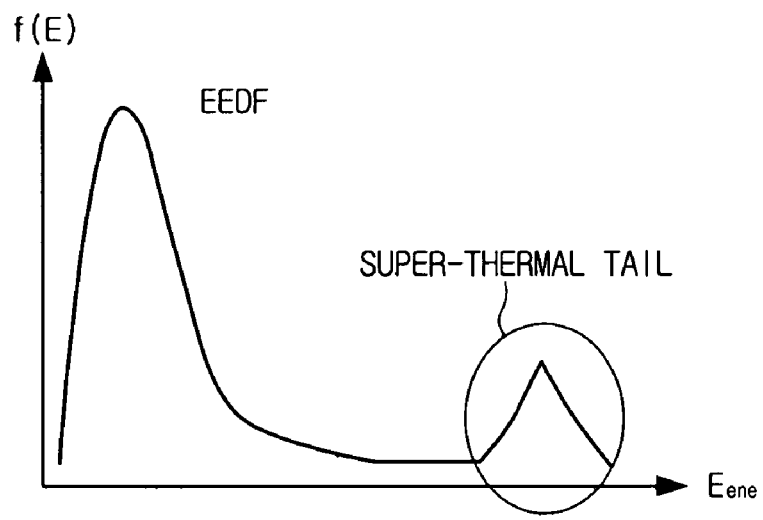
FIG. 11 is an exemplary graph illustrating a relation between an electron energy distribution function EEDF and an electron energy $E_{ene}$ at a primary plasma layer generating from the coaxial waveguide of the plasma producing unit of FIG. 7.

Under this condition, the electric field of the surface electromagnetic wave is amplified at the resonance area in the narrow primary plasma layer 112, so that it produces the super-thermal electrons that collide with the gas to ionize the gas and emit the strong UVs. As apparent from FIG. 11 showing a relation between an electron energy distribution function EEDF and an electron energy $E_{ene}$ of the primary plasma layer 112, it can be appreciated that a super-thermal tail where the super-thermal electrons are produced with the resonance phenomenon was presented in the electron energy distribution.

To sum up, according to the coaxial waveguide 106 of the plasma producing unit 105 according to the first exemplary embodiment of the present general inventive concept, (1) the supercritical plasma is produced in the vicinity of the contact between the dielectric tube 108 and the cut or truncated outer electrode 110, (2) as the supercritical plasma propagates along the dielectric tube 108 while being maintained by the surface electromagnetic wave, the primary plasma layer 112 is formed along the dielectric tube 108 surrounding the inner electrode 107, (3) at the same time, the surface electromagnetic wave nonlinearly interacts with the supercritical plasma made by the primary plasma layer 112, (4) the super-thermal electrons and the UV radiation are emitted from the primary plasma layer 112 to ionize the gas in the process chamber 170. As a result, the secondary plasma layer 113 comprising electrons and ions is formed all over in the process chamber 170.

As described above, the plasma producing unit 105 of the first exemplary embodiment of the present general inventive concept is designed on the base of two concepts including the nonlinear interaction between the microwave and the produced plasma at the plasma resonance area, and the conversion of the energy of the microwave into the electrons and photons of high energy after the nonlinear interaction. At this time, the electrons and photons of high energy irradiate the gas medium over a wide range of pressure in the process chamber 170, thereby producing the secondary plasma layer 113 having relatively homogeneous and sufficient high density.

Figure 13:
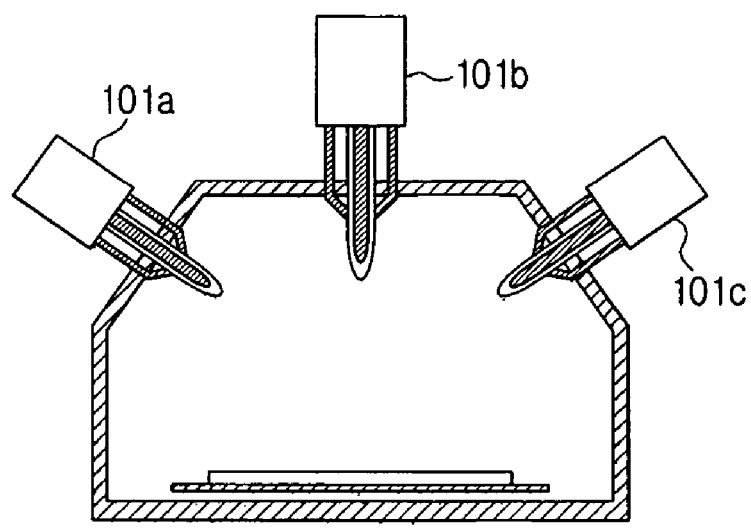
FIGS. 13 and 14 are partial cross-sectional views illustrating modified examples of the plasma etcher of FIG. 6.
Figure 14:
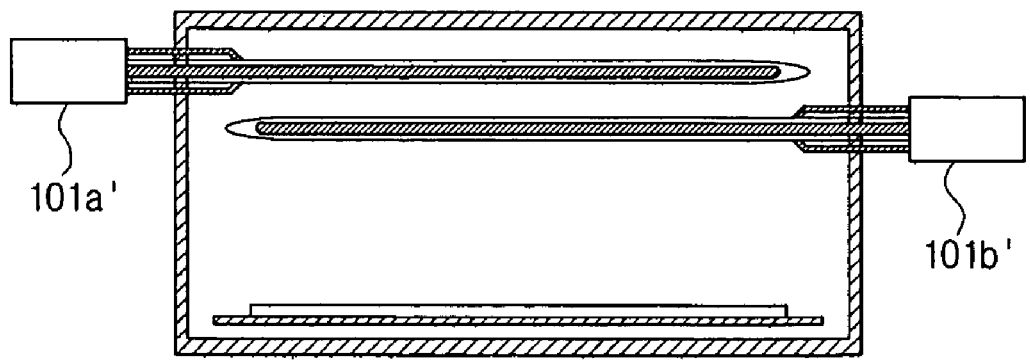

Although the plasma generating apparatus 101 according to the first exemplary embodiment of the present general inventive concept as described above has illustrated and explained as one plasma generating apparatus vertically installed at the upper wall 116 of the process chamber 170, this should not be considered as limiting. For example, in case of a plasma processing system 100' for processing a plurality of substrates or a large size of substrate as illustrated in FIG. 13, the plasma generating apparatus according to the present general inventive concept may comprise a plurality of, for example, three plasma generating apparatus 101a, 101b, and 101c that are vertically and slantingly installed. Also, in case of a plasma processing system 100" for flat panel display as illustrated FIG. 14, the plasma generating apparatus according to the present general inventive concept may comprise a plurality of, for example, two plasma generating apparatus 101a' and 101b' that are installed in zigzags to each other at same horizontal plane or different planes.

Referring again to FIG. 6, the first gas supply unit 120 is disposed at a side of an upper portion of a sidewall 117 of the process chamber 170 to supply a gas to be ionized by the coaxial waveguide 106 of the plasma producing unit 105 into the process chamber.

The first gas supply unit 120 is provided with a first gas injection part 125. The first gas injection part 125 is made of a cylindrical body 126 having injection openings 127 formed at a lower portion thereof to inject the gas.

The first gas injection part 125 is connected to a first gas source 121 through a first connecting tube 123. The first gas source 121 stores a process gas such Ar, $CF_4$, $O_2$, $SiH_4$, $SF_6$, $Cl_2$, or Hbr.

The plasma processing system 100 according to the first exemplary embodiment of the present general inventive concept can further include a second gas supply unit 190 to additionally supply a gas into the process chamber 170 thus to enhance process efficiency.

The second gas supply unit 190 is disposed at a side of a lower portion of a sidewall 117 of the process chamber 170, and is provided with a second gas injection part 197 to supply the gas into the process chamber 170.

The second gas injection part 197 is connected to a second gas source 195 through a second connecting tube 196. Like the second gas source 195, the second gas source 195 stores a process gas such Ar, $CF_4$, $O_2$, $SiH_4$, $SF_6$, $Cl_2$, or Hbr.

An inner pressure p of the process chamber 170 into which the gas is supplied as described above is maintained in a range of 0.001 Torr≦p≦2 Torr, preferably, but not necessarily, 0.01 Torr≦p≦0.1 Torr.

More particularly, an upper limit of the inner pressure p is restricted to a value of pressure by which the electromagnetic wave-absorbing and electron-accelerating resonance mechanism of the first exemplary embodiment of the present general inventive concept described above cannot be applied anymore. That is, according to the theory on the above-described phenomenon that the supercritical plasma is produced when the portion 108a of the surface of the dielectric tube 108 is intensively irradiated by the microwave in vacuum, in order to raise the resonance phenomenon of "Langmiur", discharge condition of the following formula (3) should be satisfied, since the effective electron-neutral collision frequency $\gamma_{eff}$ is a chief parameter for forming the primary plasma layer 112 of the supercritical plasma at the gas medium.

$$\gamma_{eff}/\omega < 1 \tag{3}$$

Here, ω is a circular frequency of microwave radiation incident on plasma.

Accordingly, the upper limit of the inner pressure p can be approximately determined from a condition of $\gamma_{eff}/\omega=1$. That is, since the effective electron-neutral collision frequency $\gamma_{eff}$ is close to about $5 \times 10^9$ p (Here, p is a pressure) (disclosed in "Physics of gas discharge", by Yu. P. Raizer, Moscow: Nauka, 1987, 592p) and the circular frequency ω is about $10^{10}$ s$^{-1}$, a maximum inner pressure $p_{max}$ comes to about 2 Torr from the condition of $\gamma_{eff}/\omega=1$.

Also, a lower limit of the inner pressure p is restricted to a value of pressure when a mean free path of ionization of electrons and photons coincides with a volume of the process chamber. A minimum inner pressure $p_{min}$ that satisfies such a condition is presumed to be approximately 0.001 Torr.

Although the plasma processing system 100 according to the first exemplary embodiment of the present general inventive concept as described above has explained, and illustrated as applied to a plasma etcher that forms a selectively etched pattern on the substrate 185, this should not be considered as limiting.

Figure 15:
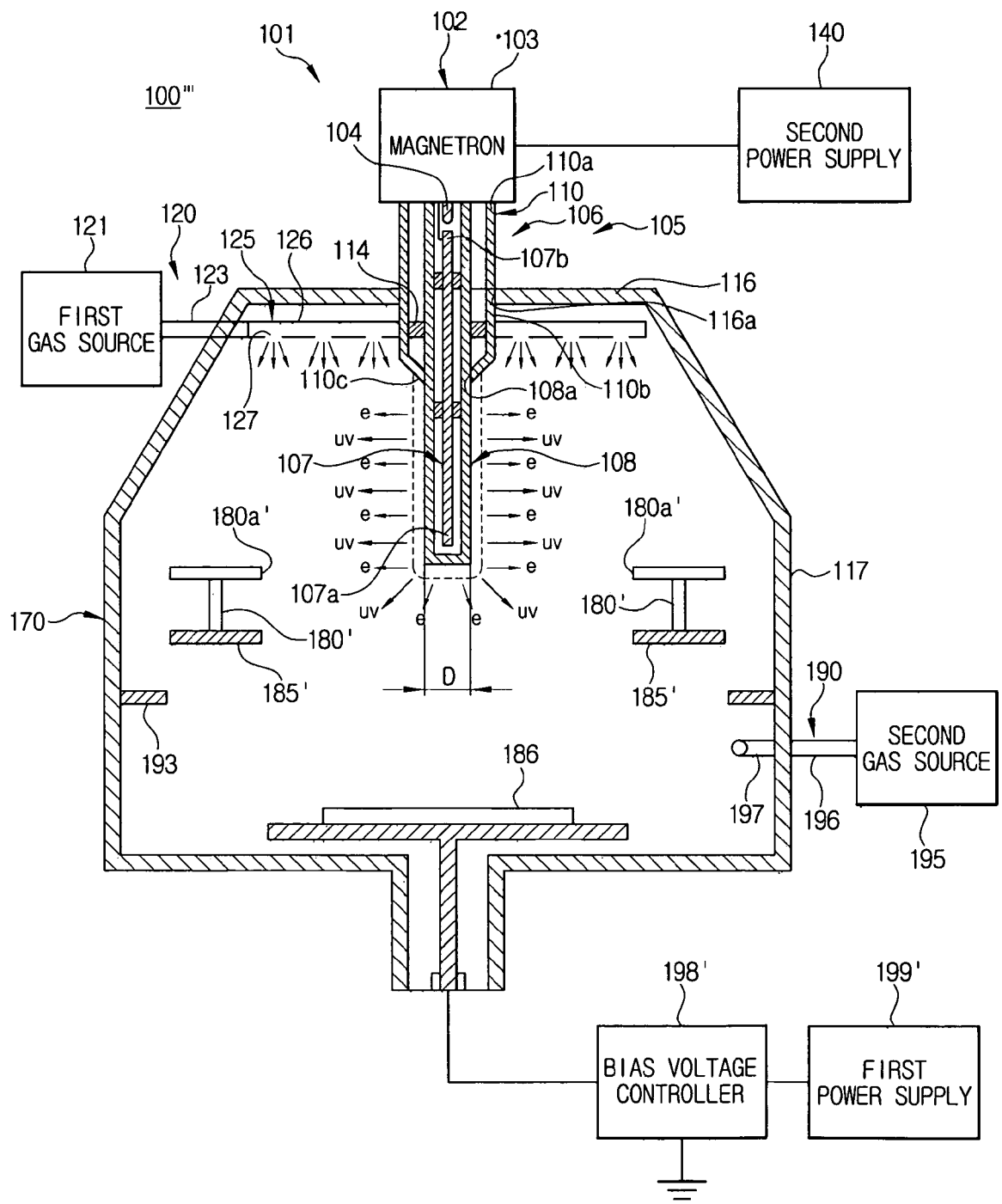
FIG. 15 is a schematic cross-sectional view illustrating a plasma sputtering system having the microwave resonance plasma generating apparatus according to the first exemplary embodiment of the present general inventive concept.

For example, the plasma processing system according to the first exemplary embodiment of the present general inventive concept is applicable to a plasma sputtering system 100''' (see FIG. 15) for depositing a thin film on a substrate that is configured by using the same construction and principle as those of the plasma processing system described above. In this case, as illustrated in FIG. 15, the plasma sputtering system 100''' further includes a sputter target 186. A predetermined bias voltage is applied to the sputter target 186 from a first power supply 199' by control of a bias voltage controller 198'. A substrate 185' is fixed to a substrate holder 180' above the sputter target 186. The substrate holder 180' is rotated based on a fixed axis (not illustrated) to uniformly deposit materials sputtered from the sputter target 186 on the substrate 185'. Also, the substrate holder 180' includes a circular opening 180a' through which the plasma produced at the plasma producing unit 105 is guided to the sputter target 186. A horizontal baffle 193 is disposed at an upper portion of the second gas injection part 197 and controls gas pressure in the vicinity of the substrate 185'.

As another example, the plasma processing system according to the first exemplary embodiment of the present general inventive concept is applicable to a PECVD system (not illustrated) in which the first power supply 199 and the bias voltage controller 198 to apply the bias voltage to the substrate holder 180 are deleted from the plasma processing system 100 illustrated in FIG. 6.

Figure 12:
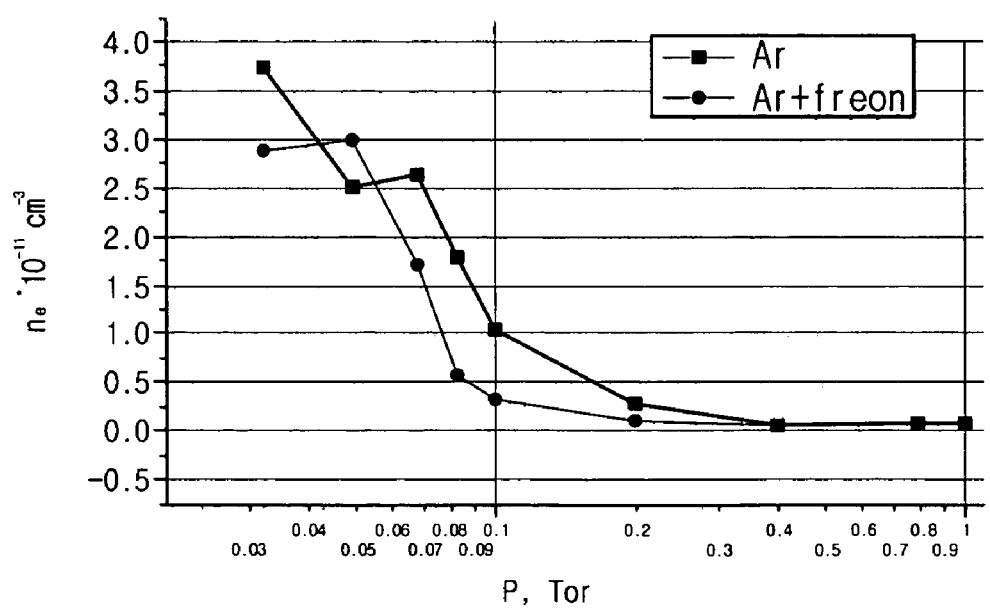
FIG. 12 is an exemplary graph illustrating a relation between an inner pressure of the process chamber and the plasma density measured at the plasma etcher of FIG. 6.

As described above, the plasma processing system 100 according to the first exemplary embodiment of the present general inventive concept is configured on the base of the electromagnetic wave-absorbing and electron-accelerating resonance mechanism which utilizes the principle of "cut or truncated electrode of coaxial waveguide" and the resonance phenomenon of Langmiur. Accordingly, the high density of plasma can be efficiently produced. That is, as illustrated in FIG. 12, according to an experiment that has measured a plasma density at a distance by 5 cm from the coaxial waveguide 106 of the plasma processing system 100 according to the first exemplary embodiment of the present general inventive concept using a microwave interferometer, it can be appreciated that the plasma density presents more than a certain value at an inner pressure p of $0.03 \text{ Torr} \leq p \leq 1 \text{ Torr}$. The experiment was carried out at a condition that the process chamber 170 was maintained at an inner pressure p in a range of $0.01 \text{ Torr} \leq p \leq 1 \text{ Torr}$, an Ar gas or a mixed gas in which Ar and freon are mixed at a rate of 8 to 2 were used, and the magnetron 102 was operated with electric power of 800 W at a frequency of about 2.45 GHz.

Particularly, it can be appreciated that in case of using the Ar gas, the plasma density presents a good value of more than $1 \times 10^{11} \text{ cm}^{-3}$ at a low pressure of 0.03 Torr (30 mTorr) through 0.1 Torr (100 mTorr), and in case of using the mixed gas including Ar and freon, the plasma density presents a good value of more than $1 \times 10^{11} \text{ cm}^{-3}$ at a low pressure of 0.03 Torr (30 mTorr) through 0.075 Torr (75 mTorr).

Further, the plasma processing system 100 according to the first exemplary embodiment of the present general inventive concept uses the coaxial waveguide 106 having a simple structure that includes the inner electrode 107 and the outer electrode 110. Accordingly, the plasma processing system 100 can simplify a structure and reduce a manufacturing cost, compared with the conventional ECT plasma generating apparatus 10, which uses a large-size waveguide 13, a large-size horn antenna 14 and a large-size electromagnet 15.

Also, the plasma processing system 100 according to the first exemplary embodiment of the present general inventive concept can increase or decrease the number of the plasma generating apparatus 101 or change the arrangement of the plasma generating apparatus 101 according to the shape, the size, and the number of objects to be processed. Accordingly, the plasma processing system 100 is able to easily control the plasma density and the distribution thereof, and applicable to plasma processing systems in various shapes and sizes.

Also, the plasma processing system 100 according to the first exemplary embodiment of the present general inventive concept can be used at a wide inner pressure p in a range of $0.001 \text{ Torr} \leq p \leq 2 \text{ Torr}$, preferably, but not necessarily, $0.01 \text{ Torr} \leq p \leq 0.1 \text{ Torr}$. Accordingly, the plasma processing system 100 is applicable to various plasma processing systems that require several process gases and pressure ranges.

An operation of the plasma processing system 100 having the aforementioned construction according to the first exemplary embodiment of the present general inventive concept will be now explained by reference to FIGS. 6 through 8.

Firstly, a process gas is supplied into the process chamber 170 through the first gas injection part 125 from the first gas source 121. The process chamber is maintained at an inner pressure p in a range of $0.001 \text{ Torr} \leq p \leq 2 \text{ Torr}$, preferably $0.01 \text{ Torr} \leq p \leq 0.1 \text{ Torr}$.

The gas supplied into the process chamber 170 collides with electron and UV radiation of high energy generated by energy of microwave applied to the coaxial waveguide 106 from the magnetron 103, thereby being ionized. At this time, the magnetron 103 is operated with electric power of about 1 KW or less at a frequency of about 2.45 GHz.

As a result, plasma consisting of electrons and ions is produced in the process chamber 170. At this time, the plasma density of the plasma comes to about $10^{11} \text{ cm}^{-3}$.

The plasma produced in the process chamber 170 acts on the substrate 185 fixed to the substrate holder 180 of the process chamber 170.

Also, a process gas is additionally supplied into the process chamber 170 through the second gas injection part 197 from the second gas source 195. Accordingly, the plasma collides with the additionally supplied process gas and becomes directional or non-directional etching ion or atom. Consequently, a thin film such, as photoresist of the substrate 185 disposed under the center of the plasma channel 110 inside the process chamber 170 is vaporized or carbonized, and thus etched.

Figure 16:
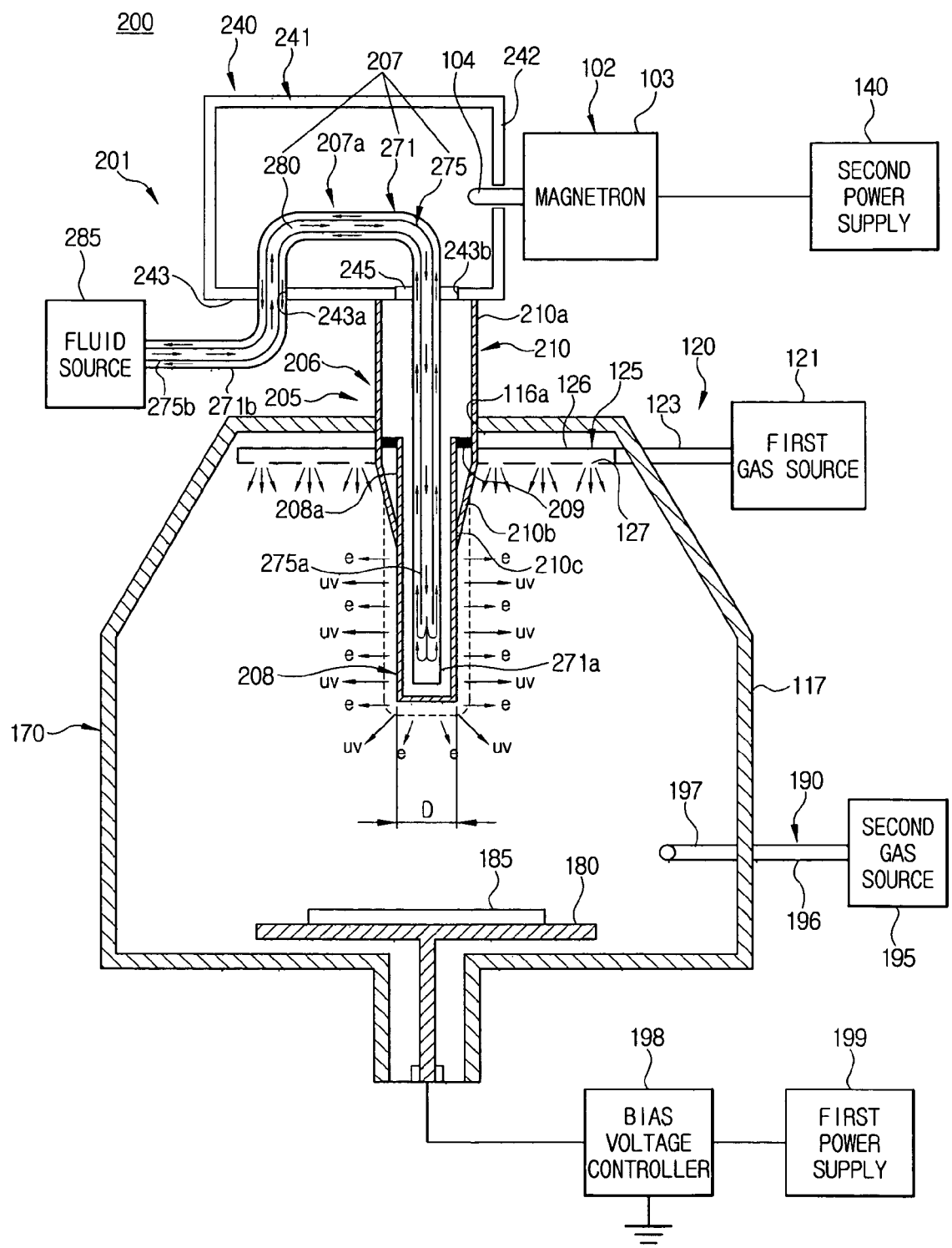
FIG. 16 is a partial cross-sectional view illustrating a plasma etcher having a microwave resonance plasma generating apparatus according to a second exemplary embodiment of the present general inventive concept.

FIG. 16 is a schematic view illustrating a plasma processing system 200 having a microwave resonance plasma generating apparatus according to a second exemplary embodiment of the present general inventive concept.

Like the first exemplary embodiment of the present general inventive concept, the plasma processing system 200 of the second exemplary embodiment of the present general inventive concept is a plasma etcher that forms a selective etching pattern on a substrate 185.

Referring to FIG. 16, the plasma processing system 200 includes a process chamber 170, a microwave resonance plasma generating apparatus 201, and a first gas supply unit 120.

Plasma is produced in the process chamber 170 by the plasma generating apparatus 201. Like the first exemplary embodiment, the plasma chamber 170 is maintained at an inner pressure p in a range of $0.001 \text{ Torr} \leq p \leq 2 \text{ Torr}$, preferably, $0.01 \text{ Torr} \leq p \leq 0.1 \text{ Torr}$.

A substrate holder 180 is disposed at an internal center of the process chamber 170. A substrate 185 on which a thin film such as photoresist to be etched is coated is fixed to the substrate holder 180. The substrate holder 180 is made of a copper block heated or cooled by a heating/cooling circuit (not shown).

A bias voltage is applied to the substrate holder 180 from a first power supply 199 by control of a bias voltage controller 198.

The microwave resonance plasma generating apparatus 201 includes a microwave generating unit 102, a resonating unit 240, and a plasma producing unit 205. Since the structure of the microwave generating unit 102 except the resonating unit 240 and the plasma producing unit 205 is the same as that of the plasma processing system 100 of the first exemplary embodiment, detailed descriptions and illustrations thereof are omitted.

As illustrated in FIG. 16, the resonating unit 240 has a resonance cavity 241 in the shape of cube or cuboid disposed between the plasma producing unit 205 and the magnetron 103 of the microwave generating unit 102 over the upper wall 116 of the process chamber 170.

The resonance cavity 241 causes the energy of microwave generated from the magnetron 103 to impedance-match and thus to be efficiently transferred to the plasma producing unit 205, and prevents the magnetron 103 from being heated or damaged by the microwave radiation reflected from the plasma producing unit 205.

As a microwave generating source, the magnetron 103 with an antenna 104 is installed at a sidewall 242 of the resonance cavity 241 to generate a microwave toward the inside of the resonance cavity 241. The sidewall 242 is electrically connected to a grounded casing of the magnetron 103 to have the same electric potential as that of the grounded casing of the magnetron 103.

The plasma producing unit 205 is connected to a bottom wall 243 of the resonance cavity 241. The plasma producing unit 205 includes a coaxial waveguide 206 having an outer electrode 210, a dielectric tube 208, and an inner electrode 207.

The outer electrode 210 is made of a conductive metal in the shape of cylinder. The outer electrode 210 has a first end 210a and a second end 210b. The first end 210a is connected to the bottom wall 243 of the resonance cavity 241 to have the same electric potential as that of the resonance cavity 241, and the second end 210b is protruded into the process chamber 170 through a supporting hole 116a of the upper wall 116 of the process chamber 170 to coaxially surround the dielectric tube 208 and the inner electrode 207.

Also, the outer electrode 210 has a length shorter than that of the inner electrode 207, so that the microwave propagated from magnetron 103 forms plasma by the principle of "cut or truncated electrode of coaxial waveguide".

The second end 210b of the outer electrode 210 located in the process chamber 170 is fixed such that a tip 210c thereof tightly contacts an outer surface of the dielectric tube 208. Particularly, the second end 210b of the outer electrode 210 is formed in a shape inclined at an angle, for example, a truncated conical shape in which the tip 210c has a sharp edge.

Alternatively, as in the outer electrode 110 of the first exemplary embodiment explained with reference to FIGS. 9A through 9C, the outer electrode 210 can be formed in the I-shaped cylindrical shape 110', the cylindrical shape 110'', or the truncated conical shape 110'''.

Also, like the outer electrode 110 of the first exemplary embodiment, the tip 210c of the second end 210b of the outer electrode 210 extended into the process chamber 170 preferably, but not necessarily, has an inner diameter D determined to satisfy the formula (1) explained above.

The dielectric tube 208 at an end 208a thereof is connected to the tip 210c of the second end 210b of the outer electrode 210 in the second end 210b thereof, and at the same, supported to the second end 210b of the outer electrode 210 by a gasket 209. The gasket 209 functions to seal between the dielectric tube 208 and the second end 210b of the outer electrode 210 so as to maintain the process chamber 170 at a predetermined inner pressure p to be described later, as well as to support the dielectric tube 208.

The dielectric tube 208 is made of non-conductive substance such as quartz, $Al_2O_3$, AlC, or AlN to insulate between the inner electrode 207 and the outer electrode 210.

Although the end 208a of the dielectric tube 208 has explained and illustrated as configured to extend only to the gasket 209, it can be configured to extend to the bottom wall 243 of the resonance cavity 241.

The inner electrode 207 is extended into the process chamber 170 through the resonance cavity 241 from a fluid source 285. The inner electrode 207 in the process chamber 170 is spaced apart from the dielectric tube 208 and the outer electrode 210.

A portion 207a of the inner electrode 207 located in the resonance cavity 241 is formed in the shape of a loop, so that the microwave can be maximally transferred with the impedance matching.

Further, in a first penetrated hole 243a of the bottom wall 243, the portion 207a of the inner electrode 207 is installed to directly contact the first penetrated hole 243a without any insulator disposed therebetween, whereas in a second penetrated hole 243b, it is supported by an insulator 245. Accordingly, the microwave is guided to the coaxial waveguide 206 by the inner electrode 207.

Also, in order to prevent the inner electrode 207 from being over-heated, the inner electrode 207 is formed in a structure capable of being cooled by heat exchanging substance.

More particularly, the inner electrode 207 has an outer cylindrical tube 271, and an inner cylindrical tube 275 that are made of conductive metal.

The outer cylindrical tube 271 has a first end 271a extended into the process chamber 170, and a second end 271b connected to the fluid source 285. The first end 271a has a closed tip, and the second end 271b has an opened tip.

The inner cylindrical tube 275 is disposed to space apart from and in the outer cylindrical tube 271. Like the outer cylindrical tube 271, the inner cylindrical tube 275 has a first end 275a extended into the process chamber 170, and a second end 275b connected to the fluid source 285. Both the first end 275a and the second end 275b have an opened tip.

The inner cylindrical tube 275 and a space between the outer cylindrical tube 271 and the inner cylindrical tube 275 are filled with a fluid 280 supplied from the fluid source 285. The fluid 280 is circulated in a direction of arrow (see FIG. 16) through the inner cylindrical tube 275 and the space between the outer cylindrical tube 271 and the inner cylindrical tube 275 by a pump (not illustrated). Heat exchanging substance such as water is preferably used as the fluid 280.

The first gas supply unit 120 is disposed at a side of an upper portion of a sidewall 117 of the process chamber 170 to supply a gas to be ionized by the coaxial waveguide 206 of the plasma producing unit 205 into the process chamber 170. The structure of the first gas supply unit 120 is the same as that of the first gas supply unit of the plasma processing system 100 of the first exemplary embodiment.

The plasma processing system 200 of the second exemplary embodiment of the present general inventive concept can further include a second gas supply unit 190 to additionally supply a gas into the process chamber 170 thus to enhance process efficiency. Since the structure of the second gas supply unit 190 is also the same as that of the second gas supply unit of the plasma processing system 100 of the first exemplary embodiment, detailed descriptions and illustrations thereof are omitted.

According to the second exemplary embodiment of the present general inventive concept as described above, the plasma processing system 200 further includes the resonating unit 240 to optimally couple the magnetron 102 to the coaxial waveguide 206 of the plasma producing unit 206 compared with the plasma processing system 100 of the first exemplary embodiment. Accordingly, under the same condition, the plasma processing system 200 can obtain higher plasma producing efficiency and can be more stably operated compared with the plasma processing system 100 of the first exemplary embodiment.

Although the plasma generating apparatus 205 of the plasma processing system 200 according to the second exemplary embodiment of the present general inventive concept has explained and illustrated as one plasma generating apparatus vertically installed at the upper wall 116 of the process chamber 170, this should not be considered as limiting. For example, in case of a plasma processing system (not illustrated) for processing a plurality of substrates or a large size of substrate like the modified plasma processing system 100' of the first exemplary embodiment illustrated in FIG. 13, the plasma generating apparatus of the plasma processing system according to the second exemplary embodiment of the present general inventive concept may comprise a plurality of plasma generating apparatus (not illustrated) that are vertically and slantingly installed. Also, in case of a plasma processing system (not illustrated) for flat panel display like the modified plasma processing system 100'' of the first exemplary embodiment illustrated FIG. 14, the plasma generating apparatus of the plasma processing system according to the second exemplary embodiment of the present general inventive concept may comprise a plurality of plasma generating, apparatus (not illustrated) that are installed in zigzags to each other at same horizontal plane or different planes.

Further, although the plasma processing system 200 according to the second exemplary embodiment of the present general inventive concept has explained and illustrated as the plasma etcher that forms the selectively etched pattern on the substrate 185, this should not be considered as limiting. For example, the plasma processing system according to the second exemplary embodiment of the present general inventive concept is applicable to a plasma sputtering system (not illustrated) for depositing a thin film on a substrate that is configured by using the same construction and principle as those of the plasma sputtering system 100''' of the first exemplary embodiment described with reference to FIG. 15, or a PECVD system (not illustrated).

An operation of the plasma processing system 200 having the aforementioned construction according to the second exemplary embodiment of the present general inventive concept is the same as that of the plasma processing system 200 of the first exemplary embodiment of the present general inventive concept explained with reference to FIG. 6, except that the energy of microwave generated from the magnetron 103 is most efficiently propagated to the outer electrode 210 and the inner electrode 207 with the impedance matching in the resonance cavity 241 and the inner electrode 207 is cooled by the fluid 280 circulated through the inner cylindrical tube 275 and the space between the inner cylindrical tube 275 and the outer cylindrical tube 271 by the pump. Therefore, detailed descriptions on the operation of the plasma processing system 200 are omitted.

As apparent from the foregoing description, the microwave resonance plasma generating apparatus and the plasma processing system having the same according to the exemplary embodiments of the present general inventive concept use the coaxial waveguide having a simple structure that includes the inner and the outer electrodes. The coaxial waveguide has the electromagnetic wave-absorbing and electron-accelerating resonance mechanism which utilizes the principle of "cut or truncated electrode of coaxial waveguide" and the resonance phenomenon of Langmiur. Accordingly, the microwave resonance plasma generating apparatus and the plasma processing system having the same according to the exemplary embodiments of the present general inventive concept can not only efficiently produce the plasma, but also simplify the structure and reduce the manufacturing cost compared with the conventional ECT plasma generating apparatus, which uses the large-size waveguide, the large-size horn antenna and the large-size electromagnet.

Further, the microwave resonance plasma generating apparatus and the plasma processing system having the same according to the exemplary embodiments of the present general inventive concept can increase or decrease the number of the plasma generating apparatus or change the arrangement of the plasma generating apparatus 101 according to the shape, the size, and the number of objects to be processed. Accordingly, the microwave resonance plasma generating apparatus and the plasma processing system having the same according to the exemplary embodiments of the present general inventive concept can not only easily control the plasma density and the distribution thereof, but also be applied to plasma processing systems of various shapes and sizes.

Also, the microwave resonance plasma generating apparatus and the plasma processing system having the same according to the exemplary embodiments of the present general inventive concept can be used at the wide inner pressure p in the range of 0.001 Torr$\leq$p$\leq$2 Torr, preferably 0.01 Torr$\leq$p$\leq$0.1 Torr. Accordingly, the microwave resonance plasma generating apparatus and the plasma processing system having the same according to the exemplary embodiments of the present general inventive concept can be applied to various plasma processing systems that require several process gases and pressure ranges.

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A microwave resonance plasma generating apparatus, comprising:
   a gas supplying unit which supplies a gas into a process chamber;
   a microwave generating unit which generates a microwave to enable production of plasma in the process chamber;
   a plasma producing unit which produces electrons and photons of high energy using the microwave generated from the microwave generating unit, and collides the electrons and photons with the gas supplied into the process chamber, to produce plasma,
   wherein the plasma producing unit comprises a coaxial waveguide comprising:
      an inner electrode disposed adjacent to the microwave generating unit;
      an outer electrode connected to the microwave generating unit and disposed to coaxially surround a portion of the inner electrode, the outer electrode being shorter than the inner electrode; and
      a dielectric tube disposed between the inner electrode and the outer electrode to insulate between the inner electrode and the outer electrode, wherein the dielectric tube has a cylindrical shape, surrounds and is spaced apart from the inner electrode, and is supported by a gasket and a tip of one end of the outer electrode.

2. The apparatus as claimed in claim 1, wherein the microwave generating unit comprises a magnetron.

3. The apparatus as claimed in claim 2, wherein the magnetron is operated with an electric power of about 1 KW or less at a frequency of about 2.45 GHz.

4. The apparatus as claimed in claim 2, wherein the magnetron is cooled by circulating heat exchanging substance.

5. The apparatus as claimed in claim 1, wherein the microwave generating unit comprises an antenna, disposed adjacent to the inner electrode, through which the microwave is propagated.

6. The apparatus as claimed in claim 1, wherein the outer electrode comprises the tip to tightly contact the dielectric tube, the tip being located at the one end of the outer electrode which is disposed on an opposite side of another end of the outer electrode adjacent to the microwave generating unit.

7. The apparatus as claimed in claim 6, wherein the outer electrode is formed in a truncated conical shape in which the one end inclines at an angle and the tip has a sharp edge, an I-shaped cylindrical shape in which the outer electrode contacts the dielectric tube over a full length, a cylindrical shape in which the one end is vertically bent to make the tip contact the dielectric tube, or a truncated conical shape in which the outer electrode is tapered over a full length and the tip of the one end contacts the dielectric tube.

8. The apparatus as claimed in claim 1, wherein the outer electrode is configured such that the tip has an inner diameter D determined to satisfy a following formula:

$$D < 1.841 \times c/\pi f,$$

where c is a speed of light, and f is a frequency of microwave, and wherein the tip is located at the one end of the outer electrode which is disposed on an opposite side of another end of the outer electrode adjacent to the microwave generating unit.

9. The apparatus as claimed in claim 1, further comprising a resonating unit disposed between the microwave generating unit and the coaxial waveguide of the plasma producing unit to impedance-match the microwave.

10. The apparatus as claimed in claim 9, wherein the resonating unit comprises a resonance cavity connected to the microwave generating unit and formed to receive and close up a portion of the inner electrode of the coaxial waveguide.

11. The apparatus as claimed in claim 10, wherein the inner electrode comprises:
a first cylindrical tube having a closed end; and
a second cylindrical tube disposed in the first cylindrical tube,
wherein a fluid is permitted to circulate through the second cylindrical tube and a space between the first cylindrical tube and the second cylindrical tube from a fluid source.

12. The apparatus as claimed in claim 11, wherein the fluid comprises heat exchanging substance.

13. The apparatus as claimed in claim 10, wherein the portion of the inner electrode inserted in the resonance cavity is formed in a shape of a loop such that the microwave is maximally transferred by the impedance matching.

14. A plasma processing system comprising:
a process chamber having a substrate holder to which a substrate is fixed;
a first gas supplying unit which supplies a gas into the process chamber; and
at least one microwave resonance plasma generating apparatus comprising a microwave generating unit disposed outside the process chamber, the microwave generating unit generating a microwave, and a plasma producing unit disposed at the process chamber which produces electrons and photons of high energy using the microwave generated from the microwave generating unit,
wherein the plasma producing unit comprises a coaxial waveguide comprising:
an inner electrode disposed adjacent to the microwave generating unit and extended into the process chamber;
an outer electrode connected to the microwave generating unit and disposed to coaxially surround a portion of the inner electrode in the process chamber, the outer electrode being shorter than the inner electrode; and
a dielectric tube disposed between the inner electrode and the outer electrode to insulate between the inner electrode and the outer electrode, wherein the dielectric tube has a cylindrical shape, surrounds and is spaced apart from the inner electrode, and is supported by a gasket and a tip of one end of the outer electrode.

15. The system as claimed in claim 14, wherein an inner pressure p of the process chamber is in a range of 0.001 Torr≦p≦2 Torr.

16. The system as claimed in claim 14, wherein the microwave generating unit comprises a magnetron.

17. The system as claimed in claim 16, wherein the magnetron is operated with an electric power of about 1 KW or less at a frequency of about 2.45 GHz.

18. The system as claimed in claim 16, wherein the magnetron is cooled by circulating heat exchanging substance.

19. The apparatus as claimed in claim 14, wherein the microwave generating unit comprises an antenna, disposed adjacent to the inner electrode, through which the microwave is propagated.

20. The system as claimed in claim 14, wherein the outer electrode comprises the tip to tightly contact the dielectric tube, the tip being located at the one end of the outer electrode extended into the process chamber.

21. The system as claimed in claim 20, wherein the outer electrode is formed in a truncated conical shape in which the end inclines at an angle and the tip has a sharp edge, an I-shaped cylindrical shape in which the outer electrode contacts the dielectric tube over a full length, a cylindrical shape in which the end is vertically bent to make the tip contact the dielectric tube, or a truncated conical shape in which the outer electrode is tapered over a full length and the tip of the end contacts the dielectric tube.

22. The system as claimed in claim 14, wherein the outer electrode is configured such that the tip has an inner diameter D determined to satisfy a following formula:

$$D < 1.841 \times c/\pi f,$$

where c is a speed of light, and f is a frequency of microwave, and wherein the tip is located at the one end of the outer electrode extended into the process chamber.

23. The system as claimed in claim 14, wherein the at least one microwave resonance plasma generating apparatus further comprises a resonating unit disposed between the microwave generating unit and the coaxial waveguide of the plasma producing unit to impedance-match the microwave.

24. The system as claimed in claim 23, wherein the resonating unit comprises a resonance cavity connected to the microwave generating unit outside the process chamber and formed to receive and close up a portion of the inner electrode of the coaxial waveguide.

25. The system as claimed in claim 24, wherein the inner electrode comprises:
a first cylindrical tube having a closed end extended into the process chamber; and a second cylindrical tube disposed in the first cylindrical tube, wherein a fluid is permitted to circulate through the second cylindrical tube and a space between the first cylindrical tube and the second cylindrical tube from a fluid source.

26. The system as claimed in claim 25, wherein the fluid comprises heat exchanging substance.

27. The system as claimed in claim 24, wherein the portion of the inner electrode inserted in the resonance cavity is formed in a shape of a loop such that the microwave is maximally transferred by the impedance matching.

28. The system as claimed in claim 14, further comprising a second gas supplying unit which additionally supplies a gas into the process chamber.

29. The system as claimed in claim 14, wherein the at least one microwave resonance plasma generating apparatus is vertically disposed.

30. The system as claimed in claim 14, wherein the at least one microwave resonance plasma generating apparatus is horizontally disposed.

31. The system as claimed in claim 14, wherein the system is a plasma etcher in which a bias voltage is applied to the substrate holder.

32. The system as claimed in claim 14, wherein the system is a plasma sputtering system further comprising a sputter target to which a bias voltage is applied, the sputter target being disposed below the substrate holder.

33. The system as claimed in claim 14, wherein the system is a plasma enhanced chemical vapor deposition (PECVD) system in which a bias voltage is not applied to the substrate holder.

* * * * *